United States Patent
Pullen et al.

(10) Patent No.: US 7,449,904 B2
(45) Date of Patent: Nov. 11, 2008

(54) INTEGRATED CIRCUIT BURN-IN METHODS AND APPARATUS

(75) Inventors: David H. Pullen, Portland, OR (US); Richard Kacprowicz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 11/168,800

(22) Filed: Jun. 28, 2005

(65) Prior Publication Data

US 2005/0240844 A1 Oct. 27, 2005

Related U.S. Application Data

(62) Division of application No. 09/897,252, filed on Jul. 2, 2001, now Pat. No. 6,980,016.

(51) Int. Cl.
  *G01R 31/02* (2006.01)
(52) U.S. Cl. ...................................... 324/760
(58) Field of Classification Search ....................... None
  See application file for complete search history.

(56) References Cited

U.S. PATENT DOCUMENTS

| | | | |
|---|---|---|---|
| 5,030,905 A | 7/1991 | Figal | |
| 5,126,656 A | 6/1992 | Jones | |
| 5,327,075 A | 7/1994 | Hashinaga et al. | |
| 5,391,502 A | 2/1995 | Wei | |
| 5,422,832 A | * | 6/1995 | Moyal ........................ 702/132 |
| 5,457,400 A | 10/1995 | Ahmad et al. | |
| 5,557,559 A | 9/1996 | Rhodes | |

(Continued)

FOREIGN PATENT DOCUMENTS

CN 1231482 10/1999

(Continued)

OTHER PUBLICATIONS

Suyko, A., et al., "Development of a Burn-In Time Reduction Algorithm Using the Principles of Acceleration Factors", *Proceedings of the Annual IEEE Reliability Physics Symposium*, Las Vegas, NV,(Apr. 9, 1991),264-270.

(Continued)

*Primary Examiner*—Jermele M Hollington
(74) *Attorney, Agent, or Firm*—Schwegman, Lundberg & Woessner, P.A.

(57) ABSTRACT

Improved methods for performing burn-in of electronic components, such as integrated circuits (ICs) with on-board thermal sense circuits, are used to obtain a higher bin split. According to an embodiment, a thermal set-point is loaded into each IC. While the ICs are maintained at a constant elevated temperature, the burn-in system checks each IC to determine whether the set-point has been exceeded. If so, it characterizes the IC by that set-point; if not, it decrements the set-point and checks again. The method continues until all ICs have been characterized to a specific set-point. As a result of the method, a junction temperature is obtained for each IC. In addition, a real-time estimate of the burn-in time for each IC is obtained, so that burn-in time can be adjusted to maximize burn-in throughput. Apparatus for implementing improved IC burn-in is also described.

29 Claims, 8 Drawing Sheets

U.S. PATENT DOCUMENTS

| | | | |
|---|---|---|---|
| 5,563,760 A * | 10/1996 | Lowis et al. | 361/103 |
| 5,798,653 A | 8/1998 | Leung, Jr. | |
| 5,822,218 A | 10/1998 | Moosa et al. | |
| 5,927,854 A | 7/1999 | Kroll | |
| 6,034,907 A | 3/2000 | Haraguchi | |
| 6,058,497 A | 5/2000 | Tuttle | |
| 6,060,895 A | 5/2000 | Soh et al. | |
| 6,119,255 A | 9/2000 | Akram | |
| 6,140,860 A | 10/2000 | Sandhu et al. | |
| 6,157,201 A | 12/2000 | Leung, Jr. | |
| 6,215,324 B1 | 4/2001 | Yoshida | |
| 6,218,889 B1 | 4/2001 | Fujiki et al. | |
| 6,349,396 B2 | 2/2002 | Akram | |
| 6,437,593 B1 * | 8/2002 | Ito et al. | 324/765 |
| 6,640,323 B2 | 10/2003 | Akram | |
| 6,717,530 B1 | 4/2004 | Schmidt et al. | |
| 6,791,315 B2 * | 9/2004 | Skerritt et al. | 324/126 |
| 6,924,636 B2 * | 8/2005 | Siade et al. | 324/158.1 |
| 6,980,016 B2 | 12/2005 | Pullen et al. | |
| 7,042,240 B2 * | 5/2006 | Lopez et al. | 324/760 |
| 7,091,737 B2 * | 8/2006 | Norris | 324/765 |
| 7,167,806 B2 * | 1/2007 | Hamann et al. | 702/136 |
| 7,187,189 B2 * | 3/2007 | Lopez et al. | 324/760 |
| 7,199,597 B2 * | 4/2007 | Tustaniwskyj et al. | 324/760 |
| 2002/0173926 A1 * | 11/2002 | McCord | 702/120 |
| 2003/0038648 A1 * | 2/2003 | Gold et al. | 324/760 |
| 2005/0099174 A1 * | 5/2005 | Siade et al. | 324/158.1 |
| 2006/0064265 A1 * | 3/2006 | Kiryu | 702/117 |
| 2007/0030020 A1 * | 2/2007 | Kinsley | 324/760 |
| 2007/0075721 A1 * | 4/2007 | Lopez et al. | 324/765 |

FOREIGN PATENT DOCUMENTS

| | | |
|---|---|---|
| JP | 5-36793 | 2/1993 |
| JP | 5-196700 | 8/1993 |
| JP | 08-213438 | 8/1996 |
| JP | 2000-97990 | 4/2000 |
| JP | 2000-206201 | 7/2000 |

OTHER PUBLICATIONS

"First Office Action for corresponding Chinese Patent Application No. 02817208.6", (Jan. 5, 2007), 8 pgs.

"Chinese Patent Application No. 2817208.6, Response to Office Action mailed May 16, 2007", 19 pgs.

"Malaysian Patent Application No. PI 20022479, Response filed Sep. 14, 2006 to Substantive Examination Adverse Report mailed Jun. 15, 2006", 18 pgs.

"Malaysian Patent Application No. PI 20022479, Substantive Examination Adverse Report mailed Jun. 15, 2006", 4 pgs.

"PCT Application No. PCT/US02/20760, International Preliminary Examination Report mailed Aug. 4, 2005", 4 pgs.

"PCT Application No. PCT/US02/20760, International Search Report mailed Oct. 30, 2002", 5 pgs.

"Prosecution File History for U.S. Appl. No. 09/897,252", (issued as US 6,980,016), 56 pgs.

* cited by examiner

INTEGRATED CIRCUIT BURN-IN METHODS AND APPARATUS

This application is a divisional of U.S. patent application Ser. No. 09/897,252, filed on Jul. 2, 2001, now issued as U.S. Pat. No. 6,980,016, which is incorporated herein by reference.

TECHNICAL FIELD

The inventive subject matter relates generally to the field of electronics and, more particularly, to improved methods and apparatus for performing burn-in testing on electronic components such as integrated circuits.

BACKGROUND

In the field of electronic systems there is an incessant competitive pressure among manufacturers to drive the performance of their equipment up while driving down production costs. This is particularly true regarding the testing of integrated circuits (hereinafter "ICs"). ICs must generally be tested before they are incorporated into an electronic assembly in order to verify that each element on the IC functions properly.

It is well known to perform accelerated life testing on ICs to ensure that the ICs do not prematurely fail when they have been incorporated into higher levels of electronic packaging, such as computer systems, (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

A goal of burn-in is to provide infant-mortality screening of ICs for reliability defects. By operating the ICs at increased voltage and/or temperature levels, while stimulating as many transistors on the ICs as possible, ICs that might fail prematurely are identified early and pulled out prior to shipment to customers. It is desirable to keep burn-in time (BITM) to a minimum to reduce production costs.

As high performance ICs are packed with increasing numbers of transistors numbering in the millions, the transistor channel length $L_e$ has been made increasingly shorter to improve performance. Generally, the shorter the channel length $L_e$ the higher the leakage current $I_{SB}$. As the leakage current $I_{SB}$ increases, so does the corresponding power requirement, and the attendant heat dissipation. Thus, testing large quantities of ICs can require substantial consumption of electrical power resources, even as such resources become increasingly scarce and costly.

It is desirable to thoroughly test ICs undergoing burn-in testing while at the same time minimizing the cost, time, and complexity of such testing.

For the reasons stated above, and for other reasons stated below which will become apparent to those skilled in the art upon reading and understanding the present specification, there is a significant need in the art for improved IC burn-in methods and apparatus.

DETAILED DESCRIPTION

In the following detailed description of embodiments of the invention, reference is made to the accompanying drawings that form a part hereof, and in which is shown by way of illustration specific preferred embodiments in which the inventive subject matter may be practiced. These embodiments are described in sufficient detail to enable those skilled in the art to practice them, and it is to be understood that other embodiments may be utilized and that logical, procedural, mechanical, and electrical changes may be made without departing from the spirit and scope of the inventive subject matter. The following detailed description is, therefore, not to be taken in a limiting sense, and the scope of the inventive subject matter is defined only by the appended claims.

The inventive subject matter provides improved methods for performing burn-in testing of electronic components, such as ICs. By comparing a temperature indication provided by an on-board thermal sense circuit located on each IC with a gradually decrementing temperature value, all of the ICs can be characterized or binned according to a desired thermal parameter, such as junction temperature. Bin split can be improved by adjusting the burn-in conditions to limit yield loss that results from thermal run-away. Further, a real-time estimate of the burn-in time for each IC is obtained, so that burn-in time can be adjusted in real-time to maximize burn-in throughput. Various embodiments are illustrated and described herein, including methods of testing and binning, as well as an IC having an interface circuit to a burn-in system, an IC burn-in system, and a computer-readable medium comprising computer instructions for instructing a processor to perform a method of binning a plurality of ICs each having a thermal sense circuit.

Figure 1:
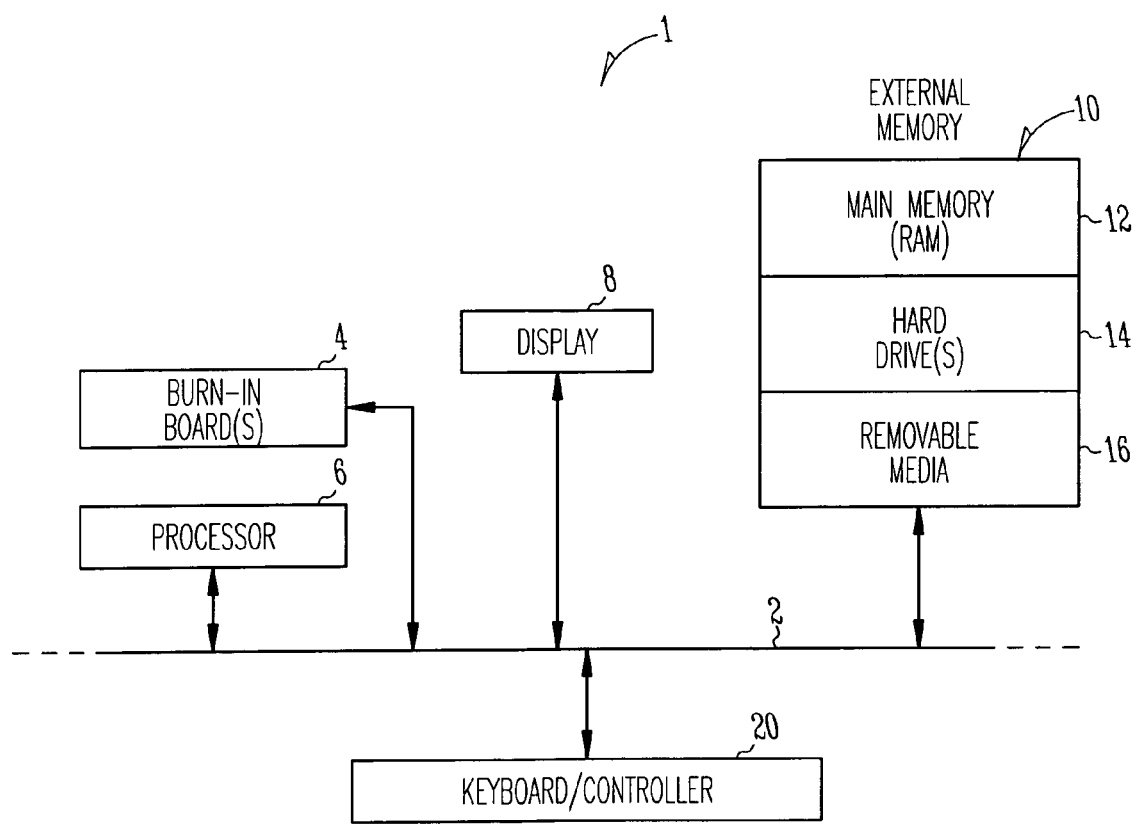
FIG. 1 illustrates a block diagram of a system to perform component burn-in testing and binning, in accordance with an embodiment of the invention.

FIG. 1 illustrates a block diagram of a burn-in system 1 to perform component burn-in testing and binning, in accordance with an embodiment of the invention. Burn-in system 1 is merely one example of a burn-in system in which the inventive subject matter can be used. In this example, burn-in system 1 is implemented with a data processing system.

Figure 3:
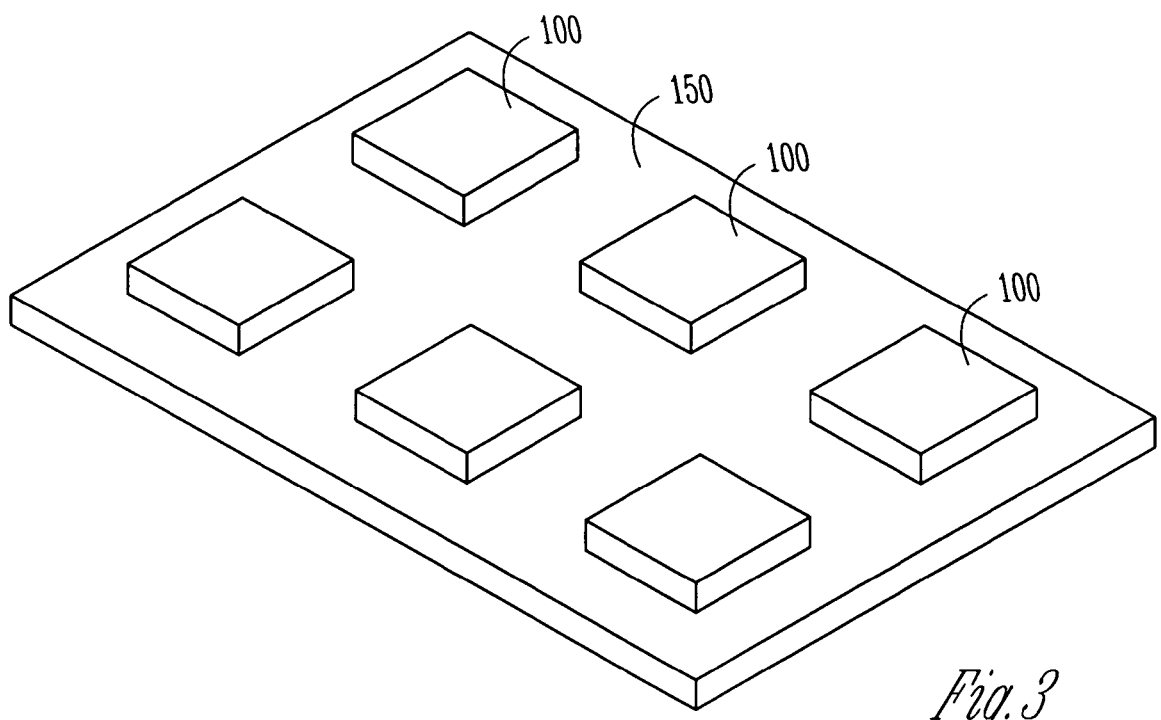
FIG. 3 is a simplified view of several electronic components mounted on a burn-in test fixture, in accordance with an embodiment of the invention.

Burn-in system 1 includes equipment such as a burn-in receptacle or fixture 4 (shown in greater detail in FIG. 3). In an embodiment, fixture 4 contains a plurality of printed circuit boards (PCBs), each of which in turn includes a plurality of ICs undergoing burn-in test; however, in other embodiments, fixture 4 could contain other types of electronic components, examples of which are described elsewhere herein.

Burn-in system 1 comprises at least one processor 6. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, an application-specific integrated circuit (ASIC), an artificial intelligence circuit, neural network, or any other type of circuit for performing processing functions, or a combination of such computational circuits.

Burn-in system 1 includes a system bus 2 to provide communications links among the various components of burn-in system 1. System bus 2 can be implemented as a single bus, as a combination of busses, or in any other suitable manner.

Burn-in system 1 can also include an external memory 10, which in turn can include one or more memory or storage elements, such as a main memory 12 in the form of random access memory (RAM), one or more hard drives 14, and/or one or more drives that handle removable media 16 such as floppy diskettes, compact disks (CDs), tape drives, and the like.

Burn-in system 1 can also include a display device 8 and a keyboard and/or controller 20, which can include a mouse, trackball, voice-recognition device, or any other device that permits a system user to input information into and receive information from burn-in system 1.

In operation, processor 6 of burn-in system 1 controls burn-in and/or binning functions under the direction of computer instructions. The computer instructions are stored on one or more computer-readable media within burn-in system 1, including any or all of the memory elements within external memory 10, and/or within memory elements such as high-speed cache (not shown) of processor 6.

Figure 2:
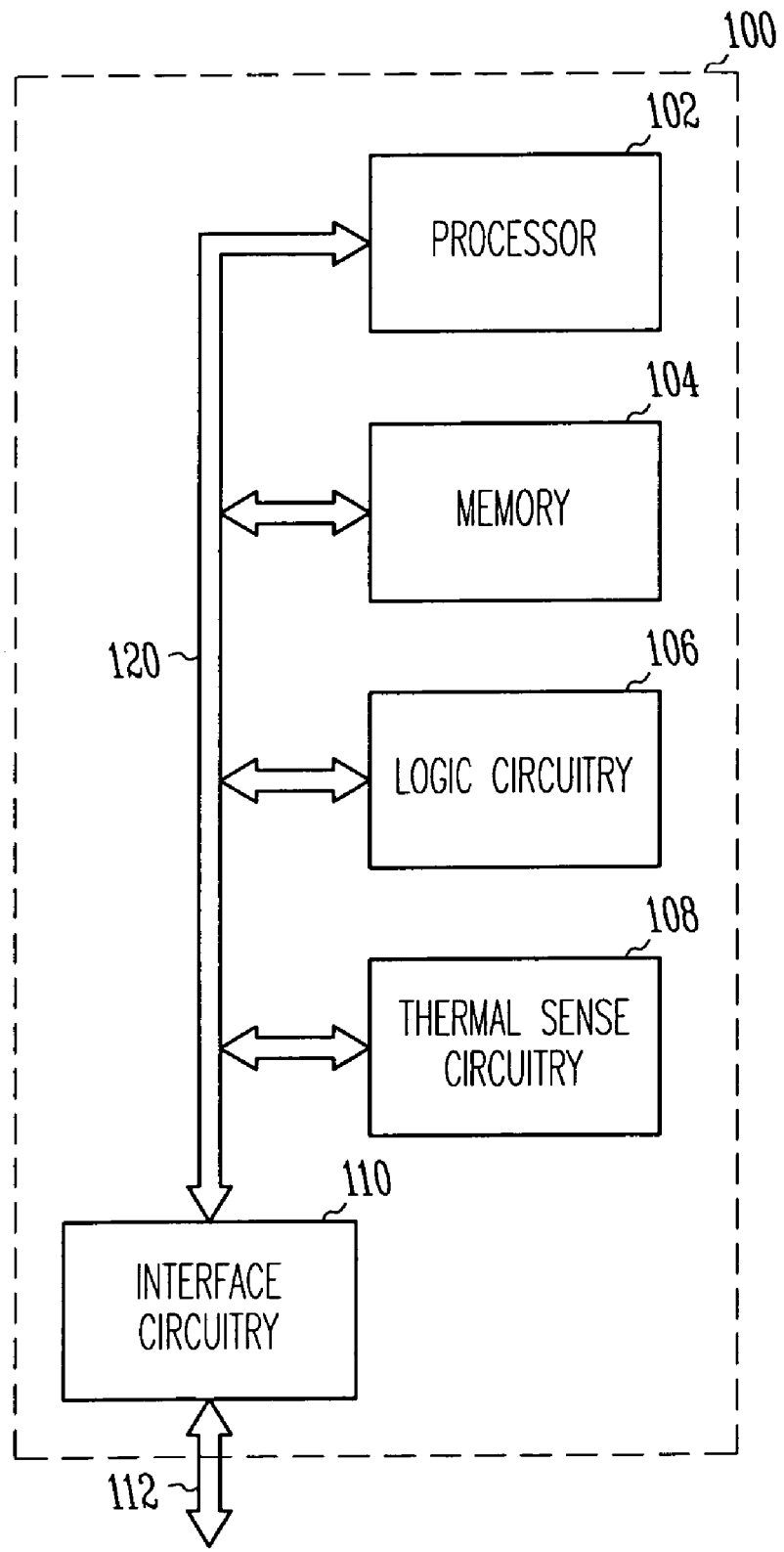
FIG. 2 illustrates an IC comprising devices to implement burn-in testing and binning, in accordance with an embodiment of the invention.

FIG. 2 illustrates an IC 100 comprising devices to implement burn-in testing and binning, in accordance with an embodiment of the invention. IC 100 is only one example of an IC that can be tested and/or binned using the inventive subject matter.

In the embodiment illustrated in FIG. 2, IC 100 comprises a processor 102, which can be any type of computational circuit such as, but not limited to, those listed earlier. Processor 102 is coupled to bi-directional internal bus 120.

However, embodiments of the inventive subject matter should not be construed as limited to the burn-in and binning of processor ICs, because it can also be applied to any other type of IC, such as memory chips, chipset components, peripheral component interconnect (PCI) devices, bus controllers, high-volume data exchange devices, amplifiers, thyristors, or the like. Any type of IC having an on-board thermal sense circuit can be tested and/or binned using the inventive subject matter.

IC 100, in this embodiment, also comprises a memory circuit or memory 104 coupled to internal bus 120. Memory 104 can be of any type or size, provided only that it has sufficient storage space to store a temperature value. In an alternative embodiment, memory 104 can be eliminated from IC 100, and a temperature value is stored in a memory circuit or memory segment of burn-in system 1 (FIG. 1).

IC 100, in this embodiment, also comprises logic circuitry 106 coupled to internal bus 120. Logic circuitry 106 can be of any type, provided only that it can perform a comparison function or match-determining function between a temperature indication generated by thermal sense circuitry 108 and a temperature value stored in memory, either in memory 104 or in burn-in system 1 (e.g. in external memory 10, FIG. 1). In an alternative embodiment, logic circuitry 106 can be eliminated from IC 100, and a match-determining function is performed by processor 6 (FIG. 1) of burn-in system 1.

IC 100 additionally comprises thermal sense circuitry 108 coupled to internal bus 120. Thermal sense circuitry 108 can be implemented by any circuit that is capable of generating a temperature parameter or temperature indication. In an embodiment, thermal sense circuitry 108 provides an indication proportional to or indicative of the substrate temperature or junction temperature on IC 100. Thermal sense circuit 108 can be implemented, for example, by a temperature-sensing diode such as a forward-biased diode.

IC 100 also comprises suitable interface circuitry 110 between internal bus 120 and test fixture bus 112, to transmit data, instructions, and/or control signals between IC 100 and burn-in system 1 (FIG. 1).

FIG. 3 is a simplified view of several electronic components 100 mounted on a burn-in test fixture 150, in accordance with an embodiment of the invention. Test board or test fixture 150 comprises a plurality of sockets or connectors (not shown) to which one or more electronic components 100 are coupled. In an embodiment, electronic components 100 are ICs; however, in other embodiments electronic components can be virtually any other type of electronic or electrical device that generates heat in operation. Examples include cellular phones, pagers, computers of all types, electric tools, appliances, entertainment equipment, aerospace and vehicular components, and the like.

Test fixture 150 comprises a bus 112 (FIG. 2) to which electronic components 100 are electrically connected to burn-in system 1 (FIG. 1).

Figure 4:
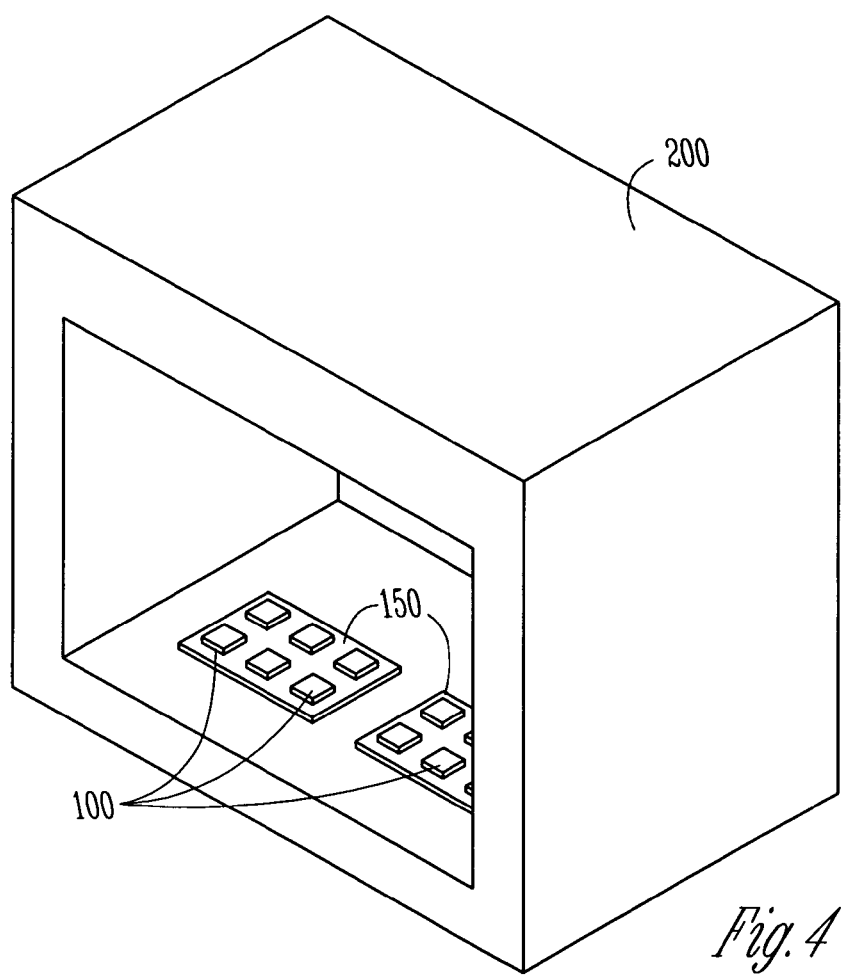
FIG. 4 is a simplified view of burn-in test fixtures in a burn-in oven, in accordance with an embodiment of the invention.

FIG. 4 is a simplified view of test fixtures 150 in a burn-in oven 200, in accordance with an embodiment of the invention. Burn-in test fixtures 150 are situated within an environmentally controlled chamber containing a temperature-altering mechanism, such as a heater and/or a chiller. In an embodiment, the chamber is heated; however, in another embodiment, the chamber could be chilled. Burn-in system 1, operating under the control of a human operator or of computer instructions, thermally stresses the electronic components 100 on test fixtures 150 by, for example, elevating the temperature in burn-in oven 200.

In an embodiment wherein the electronic components 100 being burned-in are ICs, in addition to being heat-stressed they are typically subjected to higher operating voltages. The burn-in voltage varies according to the type of IC and the process used to fabricate it. For example, a burn-in voltage of 2.1 volts is used for one current processor IC product. In addition to increasing the operating voltage, it is desirable to toggle most if not all of the circuit nodes within the ICs during the burn-in period Thus, while burn-in test fixtures 150 are inside burn-in oven 200, they are functionally connected to burn-in system 1 (FIG. 1) via a network of connectors and wires (not shown) in order to operate the ICs on test fixtures 150 at elevated operating voltage and to toggle as many circuit nodes as possible on the ICs. Burn-in oven 200 can also include power and clock circuits (not shown) to provide power and clock signals to the ICs undergoing burn-in.

Figure 5A:
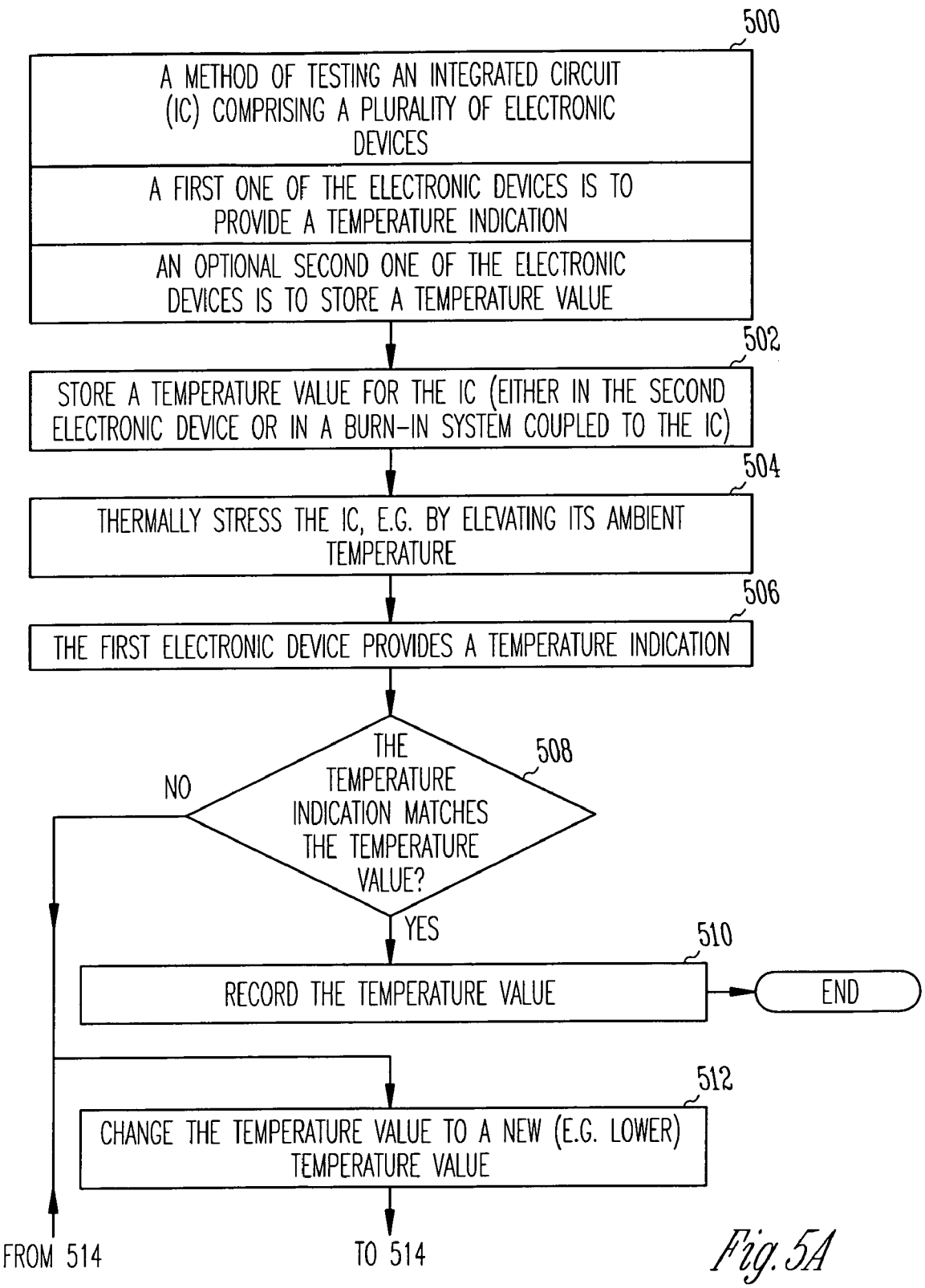
FIGS. 5A and 5B together illustrate a flow diagram of an improved method of testing an IC comprising a plurality of electronic devices, in accordance with an embodiment of the invention.
Figure 5B:
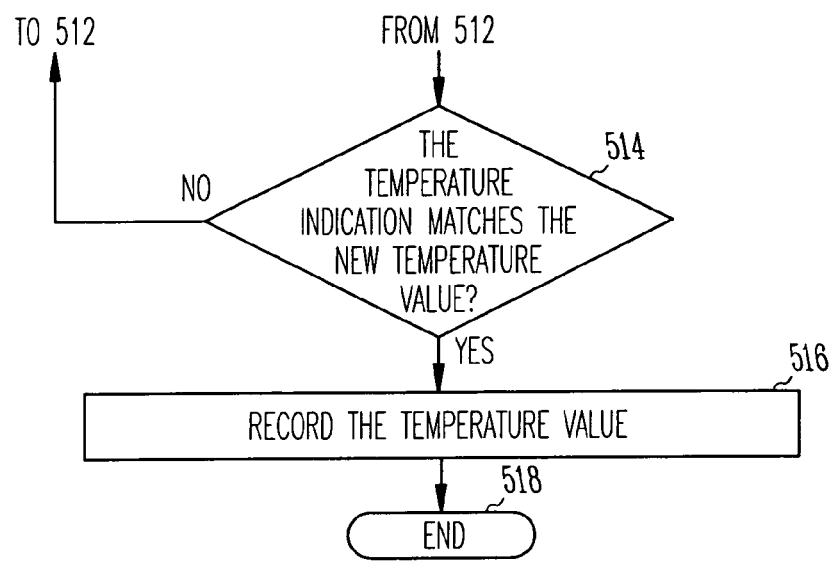

FIGS. 5A and 5B together illustrate a flow diagram of an improved method 500 of testing an IC comprising a plurality of circuits or electronic devices, in accordance with an embodiment of the invention. A first one of the electronic devices provides a temperature indication, and this device can be any suitable thermal sense device, such as thermal sense circuitry 108 (FIG. 2). An optional, second one of the electronic devices stores a temperature value, and this device can be implemented by any suitable memory storage device, such as memory circuit 104 (FIG. 2). If the optional, second memory storage device is not on the IC, the memory storage function can be performed by suitable memory storage within burn-in system 1 (FIG. 1).

In 502, a temperature value is stored for the IC, either in the second electronic device or in a burn-in system coupled to the IC. A temperature value above the highest expected junction temperature of the IC is chosen. For example, in one burn-in embodiment, a temperature value of approximately 110 degrees C. is initially stored.

In 504, the IC is thermally stressed by elevating or lowering its ambient temperature. For burning-in ICs, the temperature is raised, e.g. to 60 degrees C.

In 506, the first electronic device (e.g. a temperature sensing diode) provides a temperature indication.

In 508, a determination is made whether the temperature indication matches the stored temperature value. "Match" means having the same value or substantially the same value. If there is a match, the method goes to 510; otherwise, it goes to 512.

In 510, the temperature value is recorded, and the process ends for this IC.

In 512, the temperature value is incremented to a new temperature value, by lowering it one or two degrees (e.g. for a burn-in test), or by raising it one or two degrees (e.g. for a cold test).

In 514, a determination is made whether the temperature indication matches the new stored temperature value. If so, the method goes to 516; otherwise it returns to 512.

In 516, the temperature value is recorded.

In 518, the process ends for this IC.

Figure 6B:
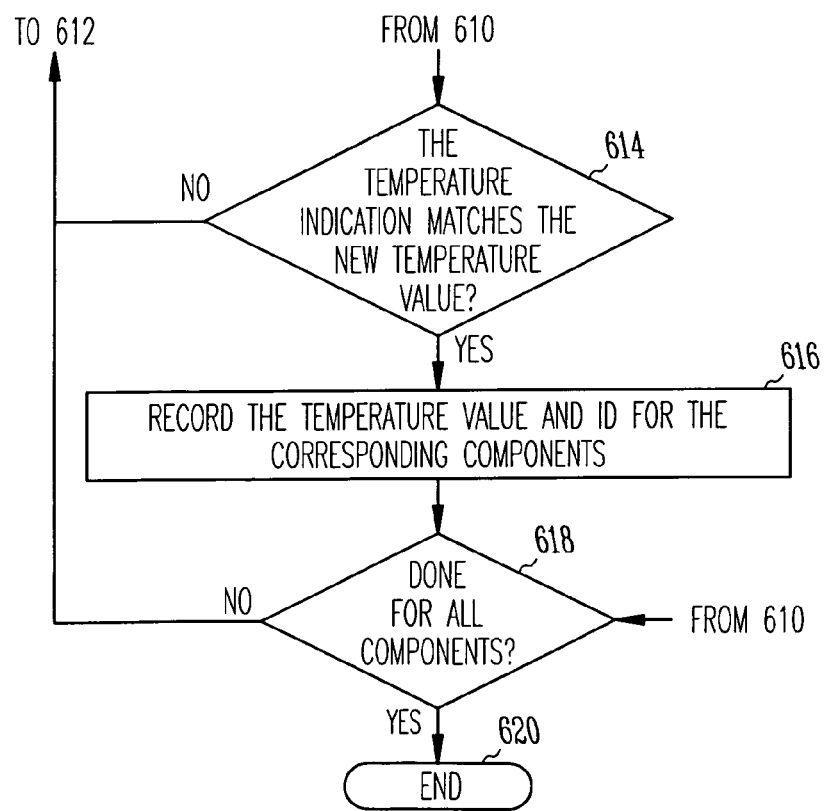
FIGS. 6A and 6B together illustrate a flow diagram of an improved method of testing a plurality of electronic components, such as ICs, in accordance with an embodiment of the invention.
Figure 6A:
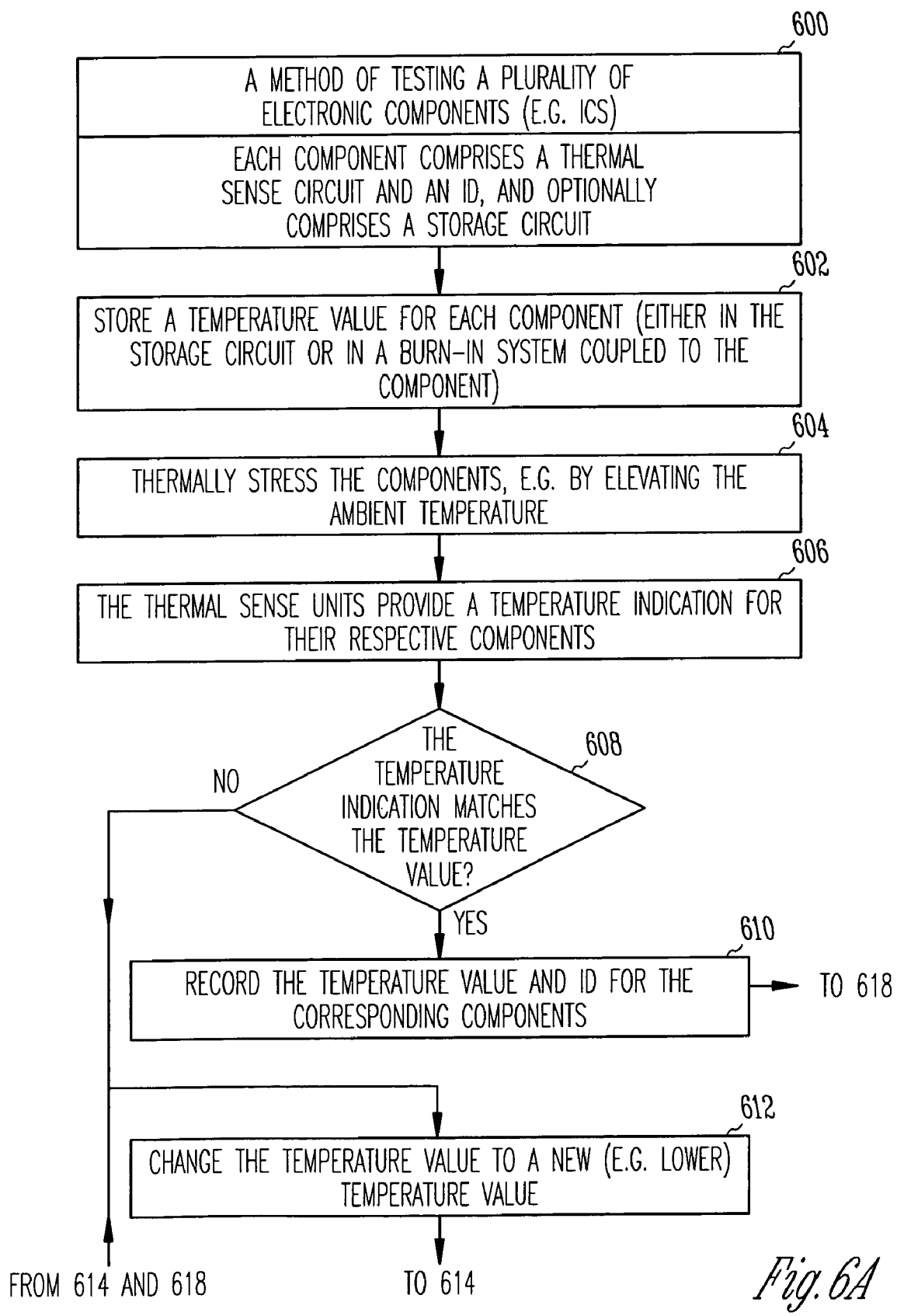

FIGS. 6A and 6B together illustrate a flow diagram of an improved method 600 of testing a plurality of electronic components, such as ICs, in accordance with an embodiment of the invention. Electronic components could also be any other type of component besides an IC, examples of which are provided elsewhere in this description. Each electronic component comprises a thermal sense circuit. Each electronic component can also comprise an optional, storage circuit. If the electronic component doesn't have the optional, storage circuit, the memory storage function can be performed by suitable memory storage within burn-in system 1 (FIG. 1). Each electronic component is also identified by a unique identification (ID), which can be of any type but is typically a number.

In 602, a temperature value is stored for each component, either in the component's optional storage circuit or in a burn-in system coupled to the component.

In 604, the components are thermally stressed, e.g. by elevating the ambient temperature.

In 606, the thermal sense units each provide a temperature indication for their respective components.

In 608, a determination is made whether the temperature indication for each of the plurality of electronic components matches the temperature value. For those components for which this is true, the process goes to 610; otherwise, it goes to 612, for those components for which this is not true.

In 610, the temperature value and unique ID are recorded for each electronic component whose temperature indication matched the temperature value in 608. From 610, the process goes to 618.

In 612, the temperature value is changed to a new temperature value (e.g. a lower temperature value for a burn-in operation).

In 614, a determination is made whether the temperature indication for each of the plurality of electronic components still being evaluated at this point matches the temperature value. If so, the process goes to 616 for those components for which the match is true; otherwise, it returns to 612 for those components for which the match is false.

In 616, the temperature value and unique ID are recorded for each electronic component whose temperature indication matched the temperature value in 616. From 616, the process goes to 618.

In 618, a determination is made whether all electronic components have had a temperature value recorded for them. If so, the process goes to 620 and ends; otherwise, it returns to 612.

In the inventive subject matter, the stimulus pattern for the components being tested during burn-in can be the same for all components under test. It is unnecessary to provide a unique test stimulus pattern to each component undergoing the burn-in test.

Figure 7A:
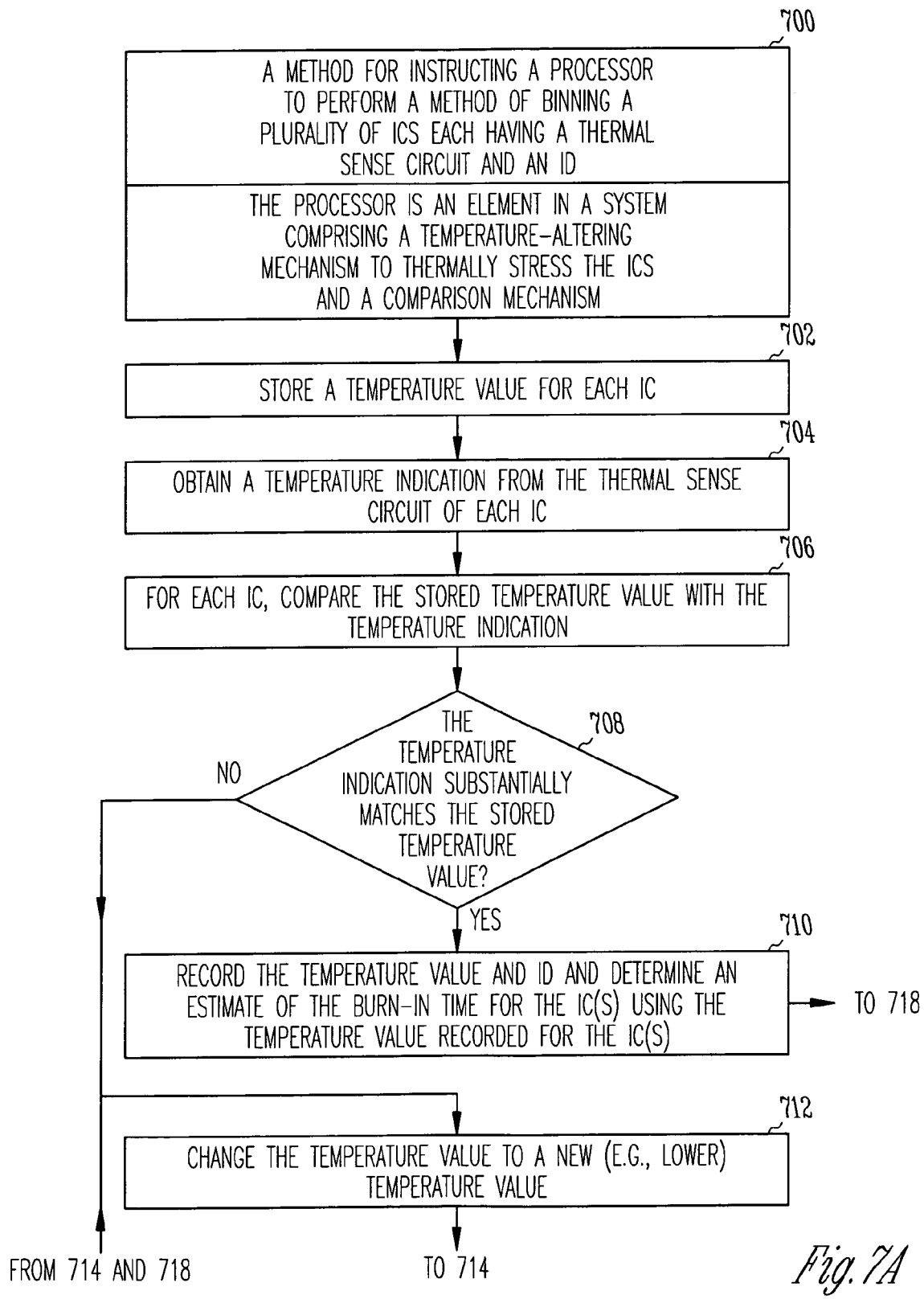
FIGS. 7A and 7B together illustrate a flow diagram of a method of instructing a processor to perform a method of binning a plurality of ICs, wherein each IC has a thermal sense circuit and a unique identifier, in accordance with an embodiment of the invention
Figure 7B:
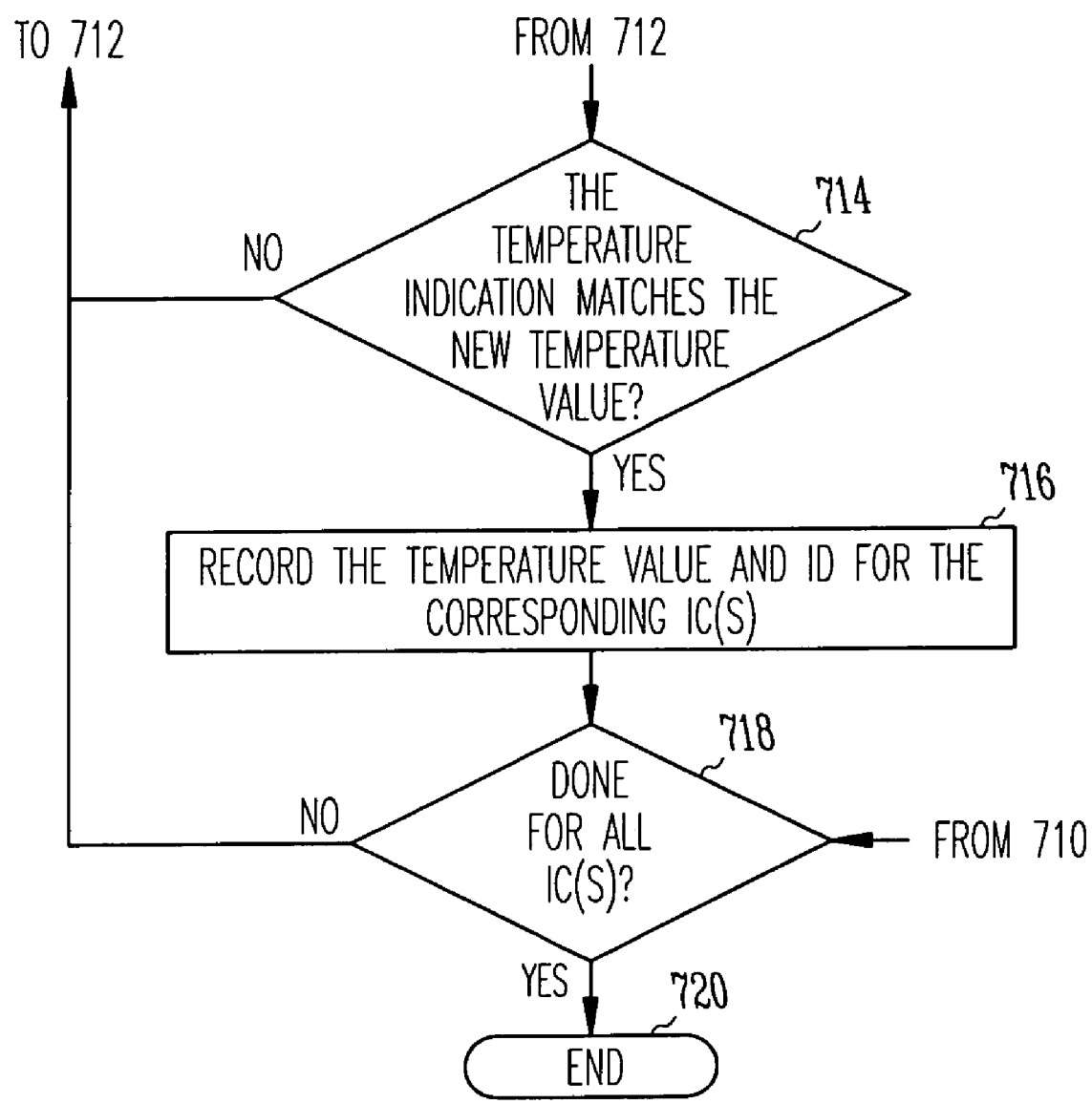

FIGS. 7A and 7B together illustrate a flow diagram of a method 700 of instructing a processor to perform a method of binning a plurality of ICs, wherein each IC has a thermal sense circuit and a unique identifier (ID), in accordance with an embodiment of the invention. The processor is an element in a system that includes a temperature-altering mechanism to thermally stress the ICs. In a burn-in system, the temperature-altering mechanism raises the ambient temperature; in a chill-down system, the temperature-altering mechanism lowers the ambient temperature. The system also includes a comparison mechanism that can be implemented in any suitable manner, e.g. using a "compare" program instruction or a hard-wired comparison circuit.

In 702, a temperature value is stored for the ICs undergoing test. For an IC burn-in operation, a temperature value above the highest expected junction temperature of any of the ICs is chosen. For example, in one burn-in embodiment, a temperature value of approximately 110 degrees C. is initially stored.

In 704, a temperature indication is obtained from the thermal sense circuit of each IC. Each temperature indication is suitably linked with the IC generating it. This can be done, for example, using the IC's ID, and storing an ID/temperature indication pair for each IC under test at this point.

In 706, for each IC, the stored temperature value is compared with its own temperature indication.

In 708, a determination is made, for each IC, whether its temperature indication substantially matches the stored temperature value. If so, the process goes to 710; otherwise, it goes to 712.

In 710, for each IC for which the match of 708 is true, the temperature value and unique ID are recorded. Also, at this time, using the temperature value recorded for the ICs for which the match of 708 is true, an estimate of the burn-in time can be calculated if desired. This estimate can be further refined as additional ICs are binned in 712 and 714, and in successive iterations of 712 and 714. From 710, the process goes to 718.

In 712, the temperature value is changed to a new temperature value (e.g. a lower temperature value for a burn-in operation).

In 714, a determination is made, for each IC, whether its temperature indication substantially matches the new stored temperature value. If so, the process goes to 716; otherwise, it returns to 712.

In 716, for each IC for which the match of 714 is true, the temperature value and unique ID are recorded.

In 718, a check is made whether all ICs have had a temperature value and ID recorded for them. If so, the process goes to 720; else, it returns to 712.

In 720, the process ends.

The operations described above with respect to the methods illustrated in FIGS. 5, 6A, 6B, 7A, and 7B can be performed in a different order from those described herein.

Determining Junction Temperature Tj for Each Component

The inventive subject matter can determine a junction temperature Tj for each IC undergoing a burn-in test. Making use of a temperature indication generated by thermal sense device on-board each IC, the burn-in system initially stores a temperature value above the highest expected junction temperature Tj for the group of ICs undergoing test. By successively comparing the temperature indication output by the thermal sense device of each IC and decrementing the temperature value in successive steps of a degree or two, eventually a match, corresponding to the junction temperature Tj, will be made and recorded for each IC in the group of ICs.

The junction temperature Tj of an IC can be represented by Equation (1) as follows:

$$T_j = T_a + (\theta_{ja} \times P_d) \quad \text{Equation (1)}$$

wherein $T_j$=junction temperature (in degrees C.);
  $T_a$=ambient temperature (in degrees C.);
  $\theta_{ja}$=the junction-to-ambient thermal resistance (in degrees C./watt), which can be in the range of 0.4-2.0 C/watt for some current processor products; and
  $P_d$=power dissipation at $T_j$ (in watts), which can be in the range of 10-60 watts for some current processors products.

By obtaining a distribution of junction temps for all ICs undergoing burn-in testing, the inventive subject matter provides a direct assessment of the burn-in test stability. It also allows an IC manufacturer to substantially remove any thermal margin from burn-in testing by allowing parts having a shorter channel length, and/or parts operating at a higher power or frequency into burn-in testing. It also increases overall bin split, as will now be discussed immediately below.

Increasing Bin Split

The inventive subject matter provides a relatively high bin split for electronic components undergoing thermal stress testing. "Bin split" is the process of evaluating a group of electronic components, such as ICs, to sort or allocate them into a number of different groups according to some characteristic. The characteristic could be, for example, a performance-related characteristic or an operational-related characteristic, such as standby current $I_{SB}$. High performance processors generally operate at a higher $I_{SB}$ value (and a correspondingly higher junction temperature Tj) compared with lower performance processors of the same design running at the same clock speed.

In general, the higher the junction temperature Tj, the shorter the burn-in time BITM. However, if the burn-in conditions are set too high, the risk of thermal run-away increases. By obtaining a Tj for each component, the burn-in conditions can be set to maximize bin split and to limit yield loss that results from thermal run-away.

In this inventive subject matter, distribution of junction temps between the lowest performance processor and highest performance processor of a batch undergoing burn-in testing can be determined at a relatively fine increment, such as degree-by-degree from 110 degrees C. down to 60 degrees C. By obtaining a Tj value for each component, thermal margin is better understood, and transistor channel length $L_E$ can be retargeted (e.g. shortened) to obtain higher frequency bin split.

How the inventive subject matter provides for a relatively high bin split will now be discussed.

Each IC has an on-chip thermal sense circuit that provides $T_j$ for the IC. Ambient temperature $T_a$ is maintained constant in the burn-in oven, e.g. at 60 C. Burn-in voltage $V_{B1}$ is maintained constant during burn-in, e.g. $V_{B1}$=2.1 volts for one current processor product having a normal operating voltage of 1.7 volts.

An initial temperature value (e.g. 110 C) is programmed for all ICs, and all ICs are checked to see whether any have a junction temperature indication $T_j$ of 110 C. Any ICs whose $T_j$ is 110 C are identified. For each of these ICs, the ID and the 110 C value are stored.

Next the temperature value is decremented to 109 C, and all ICs are again checked. Any ICs whose $T_j$ is 109 C are identified.

This is continued down to a relatively low temperature, e.g. 60 C, and/or until a $T_j$ value has been logged for all ICs (excepting those that may have failed during burn-in testing). This continuous monitoring of Tj allows the burn-in conditions to be adjusted to minimize yield loss due to thermal run-away, and thus to improve bin split.

The ICs are binned according to their $T_j$ values. Those with the highest $T_j$ values are generally capable of highest performance.

Determining Burn-In Time (BITM)

Burn-in testing to screen out infant-mortality failures by testing at elevated voltages and temps is performed for a specified length of time, referred to as the burn-in time BITM. BITM must be long enough in duration to provide satisfactory statistical and experiential assurance that most, if not all, of the failure-prone electronic components under test will have been identified. However, there is a practical upper limit to BITM duration, which is driven in part by high volume manufacturing costs (including labor costs and energy costs), by production throughput requirements, and by a potential decrease in product reliability in that the stresses applied during burn-in may adversely impact reliability once components are installed in customers' products.

The inventive subject matter can achieve significant savings in the burn-in test process by accurately determining the BITM for each component undergoing burn-in testing in the test fixture, as will now be explained.

BITM can be calculated from Equation (2):

$$BITM = A_V * A_T \quad \text{Equation (2)}$$

wherein $A_V$ is a voltage acceleration factor. For one current processor product, $A_V$ is approximately 30.

$A_T$ is a temperature acceleration factor that can vary within ICs of the same design. $A_T$ is derivable from the well-known Arrhenius relationship expressed in Equation (3):

$$A_T = \exp[(Ea/k)(1/T1 - 1/T2)] \quad \text{Equation (3)}$$

wherein Ea is an activation energy (in eV), typically in the range of 0.3-2.0 eV;
  k is Bolzmann's constant=$8.617 \times 10^{-5}$ eV/K;
  $T_1$ is the intended use temperature for the IC (in degrees C.); and
  $T_2$ is the burn-in temperature (in degrees C.).
  $A_T$ is a function of power $P_d$ dissipated from the IC, and it can vary within ICs of the same design. $P_d$ is a function of standby current $I_{SB}$ to the IC, and it can vary within ICs of the same design. $I_{SB}$ is a function of transistor channel length $L_E$ and other process parameters, and it can vary within ICs of the same design.

Using the binning operation performed earlier, $A_T$ can be obtained for each IC, so BITM can be readily calculated in real time for each individual IC undergoing burn-in, using Equation (2) above.

As a result, the BITM can be dynamically varied. For example, BITM can be shortened or lengthened to correspond with the highest calculated BITM for any IC undergoing burn-in.

Alternatively, BITM can be kept relatively constant, but certain test fixtures could be pulled from the burn-in oven early if all of their ICs have completed burn-in, and other test fixtures could be left in the burn-in oven longer, if some of their ICs require a longer than normal burn-in time.

Thus, the burn-in test process can result in significant savings in labor, energy, and production time. It can also result in a significant increase in quality over a burn-in process that uses only a static BITM.

The inventive subject matter provides improved methods for performing burn-in testing and/or binning of electronic components, such as ICs. By comparing a temperature indication provided by an on-board thermal sense circuit of each IC with a gradually decrementing thermal set-point value, all of the ICs can be characterized or binned according to a desired thermal parameter, such as junction temperature. By employing the burn-in testing concepts of the inventive subject matter, it is unnecessary to provide a unique test stimulus pattern to each component under test. The stimulus pattern can be the same for all components undergoing the burn-in test.

A relatively high bin split is obtained, because burn-in conditions can be tuned to minimize thermal run-away loss. In addition, thermal margin based upon Tj can be removed to improve BITM, e.g. by increasing the ambient temperature $T_a$. Further, a real-time estimate of the burn-in time for each IC is obtained, so that burn-in time can be adjusted to optimize burn-in throughput, and to reduce production costs.

In addition to the above-mentioned methods, an IC having an interface circuit to a burn-in system, an IC burn-in system, and a computer-readable medium comprising computer instructions for instructing a processor to perform a method of binning a plurality of ICs have been described.

As shown herein, the inventive subject matter can be implemented in a number of different embodiments. Other embodiments will be readily apparent to those of ordinary skill in the art. The elements, architecture, functions, and sequence of operations can all be varied to suit particular product and test requirements.

For example, instead of recording the temperature value when a match occurs, the temperature indication could be recorded, because it is either identical to or substantially identical to the temperature value. Also, the components undergoing burn-in testing could be subjected to other environmental accelerators, such as humidity, vibration, thermal cycling, and so forth.

Also, instead of storing a temperature value (e.g. initially a high value), comparing a temperature indication generated by a thermal sense unit on each IC with the temperature value, logging any matches, and then successively decrementing the temperature value until a Tj value has been recorded for all ICs, a slightly different implementation could be used in which a thermal set-point is loaded into each IC. While the ICs are maintained at a constant elevated temperature, the burn-in system checks each IC to determine whether the set-point has been exceeded. If so, it characterizes the component by that set-point; if not, it decrements the set-point and checks again. This process would continue until all ICs have been characterized to a specific set-point. As a result of the method, a junction temperature is obtained for each IC.

The various elements depicted in the drawings are merely representational and are not drawn to scale. Certain proportions thereof may be exaggerated, while others may be minimized. The drawings are intended to illustrate various implementations of the inventive subject matter, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the inventive subject matter. Therefore, it is manifestly intended that embodiments of this inventive subject matter be limited only by the claims and the equivalents thereof.

What is claimed is:

1. An integrated circuit (IC) comprising:
    interface circuitry to interface the IC to a burn-in system, the interface circuitry to receive at least one temperature value from the burn-in system and to send at least one temperature indication to the burn-in system;
    a storage circuit coupled to the interface circuitry to store the at least one temperature value; and
    a thermal sense circuit coupled to the interface circuitry to provide the at least one temperature indication.

2. The IC recited in claim 1, wherein the at least one temperature value is a set-point.

3. The IC recited in claim 1, wherein the at least one temperature indication is proportional to a junction temperature of the IC.

4. A burn-in system for an integrated circuit (IC), the IC comprising a thermal sense circuit, the burn-in system comprising:
    a fixture to electrically couple to the IC;
    a temperature-altering mechanism to alter the ambient temperature of the IC; and
    a data processing system coupled to the fixture, the data processing system executing a computer program, the computer program operating the burn-in system to characterize the IC and comprising the operations of:
    storing a temperature value for the IC;
    controlling the temperature-altering mechanism to thermally stress the IC;
    determining whether a temperature indication from the thermal sense circuit substantially matches the temperature value;
    if so, recording the temperature value and binning the IC at that temperature value; and
    if not, changing the temperature value to a new temperature value and determining whether the temperature indication matches the new temperature value.

5. The burn-in system recited in claim 4, wherein the computer program operating the burn-in system further comprises the operations of:
    determining whether the temperature indication matches the new temperature value;
    if so, recording the new temperature value and binning the IC at that temperature value;
    otherwise, repeatedly changing the temperature value and comparing the temperature indication with the changed temperature value, until the temperature indication matches the changed temperature value; and
    recording the changed temperature value.

6. The burn-in system recited in claim 4, wherein the temperature value is stored in a storage circuit in the IC.

7. The burn-in system recited in claim 4, wherein the temperature value is stored in a storage element in the data processing system.

8. A method of testing an integrated circuit (IC) comprising a plurality of electronic devices, one of which is to provide a temperature indication, the method comprising:
- storing a temperature value for the IC;
- thermally stressing the IC;
- the one electronic device providing a temperature indication;
- determining whether the temperature indication matches the temperature value;
  - if so, recording the temperature value and binning the IC at that temperature value; and
  - if not, changing the temperature value to a new temperature value and determining whether the temperature indication matches the new temperature value.

9. The method recited in claim 8 and further comprising;
- if the temperature indication matches the new temperature value, recording the temperature value and binning the IC at that temperature value;
- otherwise, repeatedly changing the temperature value and comparing the temperature indication with the changed temperature value, until the temperature indication matches the changed temperature value; and
- recording the changed temperature value.

10. The method recited in claim 8, wherein storing is performed by another one of the plurality of electronic devices in the IC.

11. The method recited in claim 8, wherein storing is performed by a burn-in system coupled to the IC and comprising a stored-program digital computer.

12. The method recited in claim 8, wherein the plurality of electronic devices includes a logic circuit, and wherein determining is performed by the logic circuit.

13. The method recited in claim 8, wherein determining is performed by a burn-in system coupled to the IC and comprising a stored-program digital computer.

14. A method of testing a plurality of integrated circuits (ICs), each comprising a thermal sense circuit, the method comprising:
- storing a temperature value;
- thermally stressing the ICs;
- each thermal sense circuit providing a temperature indication for its respective IC;
- determining whether the temperature indication matches the temperature value;
  - if so, recording the temperature value for the corresponding IC and binning the IC at that temperature value; and
  - if not, changing the temperature value to a new temperature value and determining whether the temperature indication matches the new temperature value.

15. The method recited in claim 14 and further comprising;
- if the temperature indication matches the new temperature value, recording the temperature value for the corresponding IC and binning the IC at that temperature value;
- otherwise, repeatedly changing the temperature value and comparing the temperature indication with the changed temperature value, until the temperature indication matches the changed temperature value; and
- recording the changed temperature value for the respective IC.

16. The method recited in claim 14, wherein each IC comprises a storage circuit, and wherein storing is performed by the storage circuit.

17. The method recited in claim 14, wherein storing is performed by a burn-in system coupled to the IC and comprising a stored-program digital computer.

18. The method recited in claim 14, wherein each IC comprises a logic circuit, and wherein determining is performed by the logic circuit.

19. The method recited in claim 14, wherein determining is performed by a burn-in system coupled to the IC and comprising a stored-program digital computer.

20. A method of testing a plurality of electronic components, each comprising a thermal sense circuit, the method comprising:
- storing a temperature value for each electronic component;
- thermally stressing the electronic components;
- each thermal sense circuit providing a temperature indication for its respective electronic component;
- determining whether the temperature indication matches the temperature value;
  - if so, recording the temperature value for the corresponding electronic component and binning the electronic component at that temperature value; and
  - if not, changing the temperature value to a new temperature value and determining whether the temperature indication matches the new temperature value.

21. The method recited in claim 20 and further comprising;
- if the temperature indication matches the new temperature value, recording the temperature value for the corresponding electronic component and binning the electronic component at that temperature value;
- otherwise, repeatedly changing the temperature value and comparing the temperature indication with the changed temperature value, until the temperature indication matches the changed temperature value; and
- recording the changed temperature value for the respective electronic component.

22. The method recited in claim 20, wherein each electronic component comprises a storage circuit, and wherein storing is performed by the storage circuit.

23. The method recited in claim 20, wherein storing is performed by a burn-in system coupled to the electronic component and comprising a stored-program digital computer.

24. The method recited in claim 20, wherein each electronic component comprises a logic circuit, and wherein determining is performed by the logic circuit.

25. The method recited in claim 20, wherein determining is performed by a burn-in system coupled to the electronic component and comprising a stored-program digital computer.

26. The method recited in claim 20, wherein the electronic components are integrated circuits.

27. A computer-readable medium containing computer instructions for instructing a processor to perform a method of binning a plurality of integrated circuits (ICs) each having a thermal sense circuit, the processor forming an element in a system comprising a temperature-altering mechanism to thermally stress the ICs and a comparison mechanism, wherein the instructions comprise:
- storing a temperature value;
- obtaining a temperature indication from the thermal sense circuit of each IC;
- for each IC not yet binned, comparing the stored temperature value with the temperature indication; and if the temperature indication substantially matches the stored temperature value, recording the temperature value and binning the IC at that temperature value;

otherwise, changing the temperature value to a new temperature value and comparing the new temperature value with the temperature indication.

28. The computer-readable medium recited in claim 27, wherein the instructions further comprise:

if the temperature indication substantially matches the new temperature value, recording the new temperature value and binning the IC at that temperature value;

otherwise, repeatedly changing the temperature value and comparing the temperature indication with the changed temperature value, until the temperature indication substantially matches the changed temperature value, and recording the changed temperature value.

29. The computer-readable medium recited in claim 27, wherein the instructions further comprise:

determining an estimate of the burn-in time for each IC, using the particular temperature value recorded for each IC.

* * * * *